(12) United States Patent
Hsieh

(10) Patent No.: US 7,929,307 B2
(45) Date of Patent: Apr. 19, 2011

(54) MEMORY MODULE ASSEMBLY AND HEAT SINK THEREOF

(76) Inventor: Ming-Yang Hsieh, Dali (TW)

( * ) Notice: Subject to any disclaimer, the term of this patent is extended or adjusted under 35 U.S.C. 154(b) by 0 days.

(21) Appl. No.: 12/626,907

(22) Filed: Nov. 29, 2009

(65) Prior Publication Data

US 2010/0071884 A1    Mar. 25, 2010

Related U.S. Application Data

(63) Continuation of application No. 11/767,493, filed on Jun. 23, 2007, now Pat. No. 7,679,913.

(30) Foreign Application Priority Data

May 11, 2007 (TW) .............................. 96116958 A
May 11, 2007 (TW) .............................. 96116959 A

(51) Int. Cl.
*H05K 7/20* (2006.01)
(52) U.S. Cl. ........ 361/707; 361/704; 361/710; 361/715; 361/719; 165/80.3; 257/707
(58) Field of Classification Search .................. 361/704, 361/707, 709, 710, 715, 717, 719, 721
See application file for complete search history.

(56) References Cited

U.S. PATENT DOCUMENTS

| | | | | |
|---|---|---|---|---|
| 6,130,820 A * | 10/2000 | Konstad et al. | | 361/695 |
| 7,061,760 B2 * | 6/2006 | Hornung et al. | | 361/695 |
| 7,375,964 B2 * | 5/2008 | Lai et al. | | 361/704 |
| 7,400,506 B2 * | 7/2008 | Hoss et al. | | 361/715 |
| 7,446,410 B2 * | 11/2008 | Wehrly et al. | | 257/707 |
| 7,471,514 B2 * | 12/2008 | Chen | | 361/695 |
| 7,489,514 B2 * | 2/2009 | Hamasaki et al. | | 361/721 |
| 7,532,477 B2 * | 5/2009 | Hsu | | 361/704 |
| 2007/0008703 A1 * | 1/2007 | Park et al. | | 361/704 |
| 2007/0211438 A1 * | 9/2007 | Foster et al. | | 361/721 |
| 2008/0116571 A1 * | 5/2008 | Dang et al. | | 257/721 |
| 2008/0285229 A1 * | 11/2008 | Watanabe et al. | | 361/687 |

* cited by examiner

*Primary Examiner* — Jayprakash N Gandhi
*Assistant Examiner* — Courtney Smith
(74) *Attorney, Agent, or Firm* — Chun-Ming Shih

(57) ABSTRACT

A memory module assembly includes a plurality of memory modules and a heat sink assembly. Each of the memory modules includes at least one heat source. The heat sink assembly includes a heat dissipating plate and a plurality of heat transfer mediums. Each of the heat transfer mediums includes a base attached to the heat dissipating plate, and at least one resilient sheet extending from an end of the base. The base and the resilient sheet define an included angle which is non-right angle so that the resilient sheet can snugly clip to the respective heat source.

6 Claims, 9 Drawing Sheets

MEMORY MODULE ASSEMBLY AND HEAT SINK THEREOF

CROSS REFERENCE TO RELATED APPLICATION

This is a continuation of application Ser. No. 11/767,493, filed on Jun. 23, 2007 now U.S. Pat. No. 7,679,913.

BACKGROUND OF INVENTION

1. Field of Invention

The present invention relates to a memory module assembly and a heat sink assembly configured to be fitted to the memory module assembly, and in particular to a heat sink assembly for radiating heat generated from a fully buffered dual in-line memory module (FBDIMM), a printed circuit board (PCB) of the FBDIMM on which the advanced memory buffer (AMB) package is mounted.

2. Related Prior Art

A memory module may be classified into a single in-line memory module (SIMM) and a dual in-line memory module (DIMM). The SIMM includes a row of memory chips mounted on only one side of the PCB, and the DIMM has two rows of the memory chips mounted on both sides of the PCB respectively.

In order to improve transmission efficiency, a fully buffered DIMM (FBDIMM) has been provided. FBDIMM has a hub, such as an advanced memory buffer (AMB) logic chip that is mounted on the center of the memory module. The AMB chip receives packet signals including a memory command and/or data from an external host (e.g., a memory controller), and provides the received data to respective memory chips. In addition, the AMB chip packetizes data outputted from the memory chips, and provides the packets to the memory controller. In the FBDIMM, signals from external sources are transmitted to the respective memory chips via the AMB chip. Accordingly, all signal lines on which the signals are transmitted are coupled to the AMB chip. Consequently, a large load is concentrated on the AMB chip and high heat may be generated in the AMB chip. High heat reduces the life span of the AMB chip and lowers the operational reliability of peripheral circuits of the AMB chip. Hence, it is advantageous to quickly dissipate away the heat from the AMB chip.

As shown in FIGS. 11 and 12, Taiwan Patent No. 1273688 discloses a memory module integrated mechanism 100 mounted on a motherboard 200, which comprises a plurality of FBDIMMs 110 and a heat sink 120. Each of the FBDIMMs 110 includes a PCB 111, a row of memory chips 112 mounted on the PCB 111, an AMB chip 113 attached to one of the memory chips 112, and a heat sink plate 114. The heat sink plate 114 is attached to the AMB chip 113 and is parallel to the PCB 111 for radiating heat generated from the AMB chip 113. Furthermore, the heat sink 120 is disposed above the FBDIMMs 110 and contacts with each one of the heat sink plates 114 of the FBDIMMs 110. The heat sink 120 comprises a heat dissipating plate 121 and a plurality of clipping members 122 extending from the heat dissipating plate 121. The heat dissipating plate 121 is perpendicular with each one of the PCBs 111 of the FBDIMMs 110. Each of the clipping members 122 extends toward the respective heat sink plate 114 and includes two parallel clipping sheets 122a as depicted in FIG. 12. A top portion of each of the heat sink plates 114 is sandwiched in between the two respective clipping sheets 122a. However, there is not disclosed how the clipping members 122 and the heat dissipating plate 121 are connected in the specification. Generally, the connection may be fulfilled by welding or the like, but requiring much time and work. In addition, the two parallel clipping sheets 122a can only contact the top portion of the heat sink plate 114, which means only little area of the heat sink plate 114 is used for heat transferring to the heat dissipating plate 121. Hence, the heat dissipating efficiency is limited.

SUMMARY OF INVENTION

The primary object of this invention is therefore to provide an improved heat sink assembly of a memory modules assembly, which is easy to be assembled and provides increased heat dissipating efficiency.

According to the present invention, a memory module assembly and a heat sink assembly applying for the memory module assembly are disclosed. The memory module assembly comprises a plurality of memory modules and the heat sink assembly. Each of the memory modules includes at least one heat source, such as an AMB chip. The heat sink assembly comprises a heat dissipating plate and a plurality of heat transfer mediums. Each of the heat transfer mediums includes a base attached with the heat dissipating plate, and at least one resilient sheet extending from an end of the base. The base and the resilient sheet define an included angle which is non-right angle so that the resilient sheet can snugly clip to the respective heat source by resilience.

Preferably, the heat dissipating plate defines at least one slit therein. The resilient sheet is inserted into the slit to clip to the heat source. The heat transfer medium further includes a fastening portion disposed on the resilient sheet so that the base can be firmly attached to the heat dissipating plate.

Further benefits and advantages of the present invention will become clear as the description proceeds.

BRIEF DESCRIPTION OF DRAWINGS

The invention will now be elucidated with reference to the following description and accompanying drawings where.

DETAILED DESCRIPTION OF PREFERRED EMBODIMENT

With reference to FIGS. 1 to 10, description will be given of a memory module assembly including a heat sink assembly 4 according to the preferred embodiment of this invention.

Figure 1:
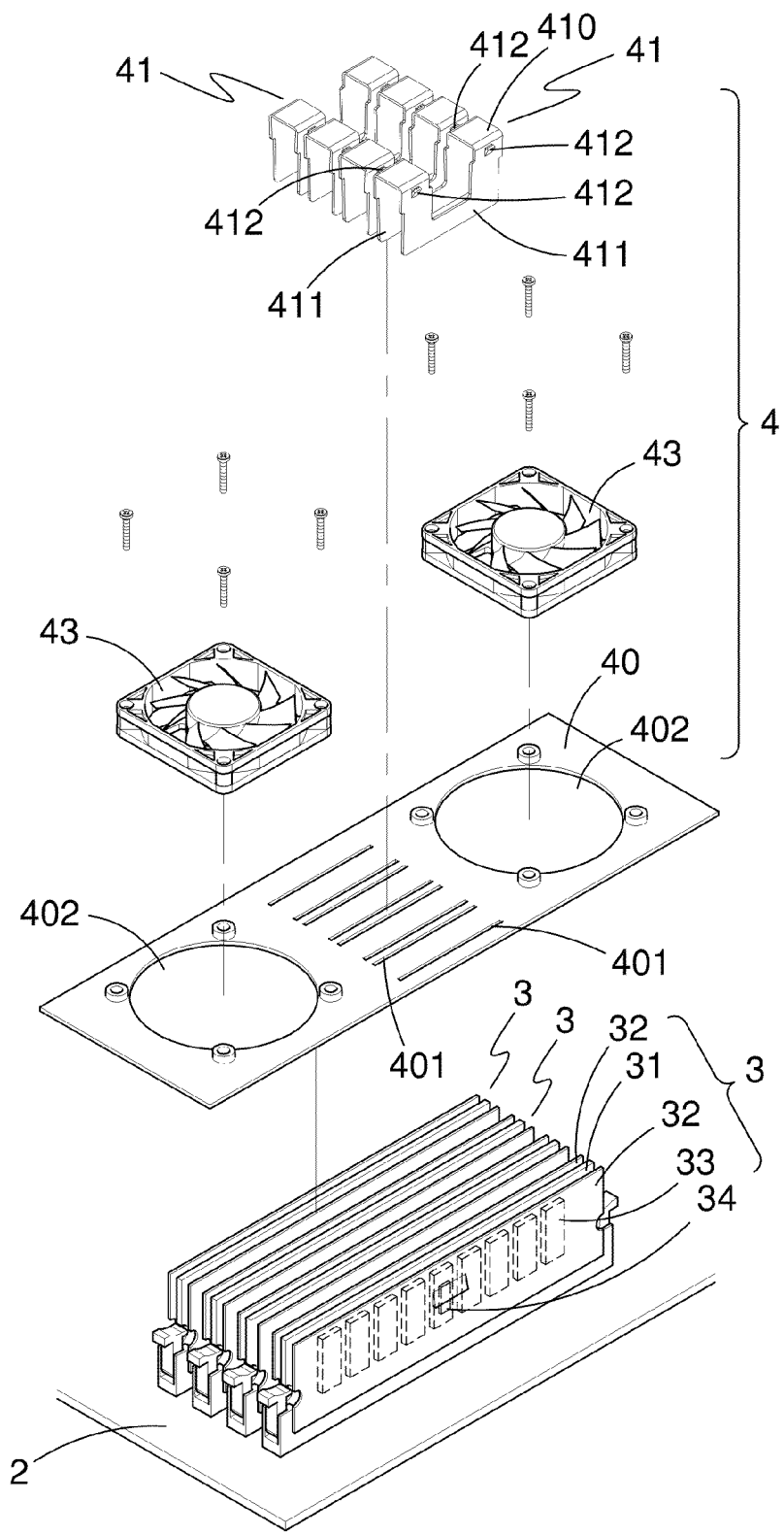
FIG. 1 is an exploded view of a memory module assembly of the preferred embodiment being mounted on a motherboard according to the present invention.

FIG. 1 shows that the memory module assembly comprises a plurality of memory modules 3 mounted on a motherboard 2, and the heat sink assembly 4.

Each of the memory modules 3, such as an FBDIMM, comprises a PCB 31, a plurality of memory chips 33, two hub chips 34 (eg. an AMB chip), and two heat sink plates 32. The memory chips 33 are mounted on both sides of the PCB 31. Each side of the PCB 31 includes one hub chip 34 mounted on one of the memory chips 33. The hub chips 34 are configured to connect memory chips 33 via a respective memory chip interface. As mentioned above, a large load is concentrated on each of the hub chips 34, namely the AMB chips, and high heat may be generated in the hub chips 34, namely heat sources. The heat sink plates 32 are attached to the hub chips 34 respectively for radiating heat generated from the hub chips 34.

It should be noted that the heat source of this embodiment is the AMB chips while in other instance, a heat source may be just a memory chip when a traditional SIMM or DIMM is used, where there is no hub chip thereon. In that kind of case, the heat sink plate can be directly attached to the memory chip.

In this preferred embodiment, the heat sink assembly 4 comprises a heat dissipating plate 40, a plurality of heat transfer mediums 41, and two fans 43.

Figure 2:
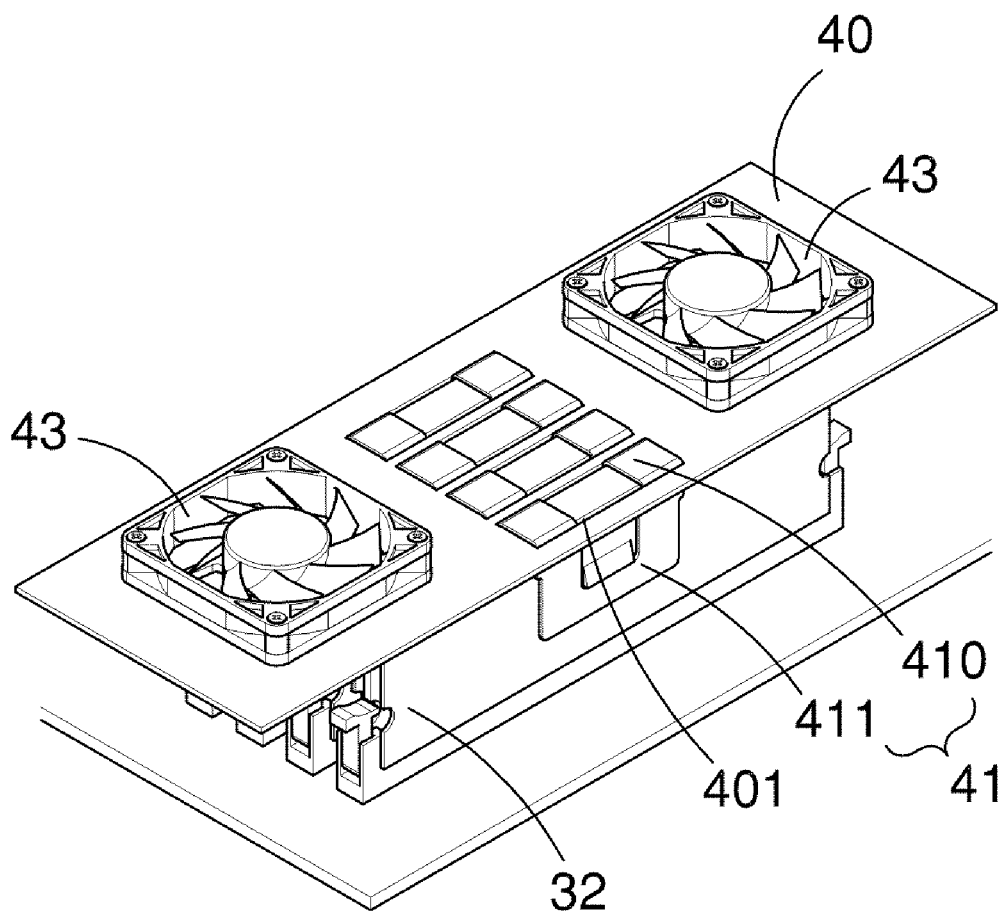
FIG. 2 is a perspective view of FIG. 1.
Figure 3:
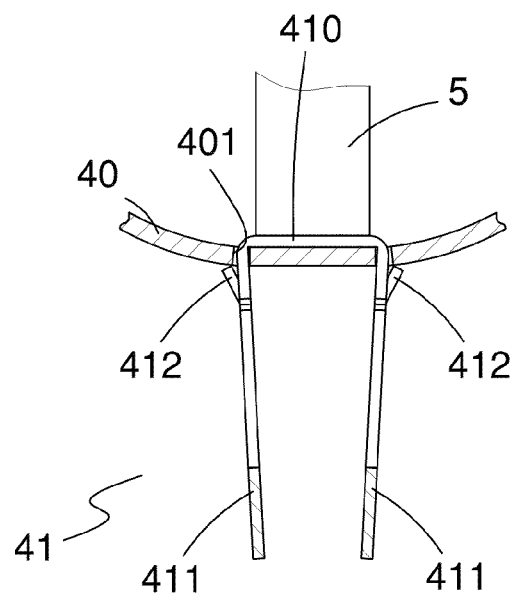
FIG. 3 shows a load punching on a base of a heat transfer medium so as to bend a heat dissipating plate.
Figure 4:
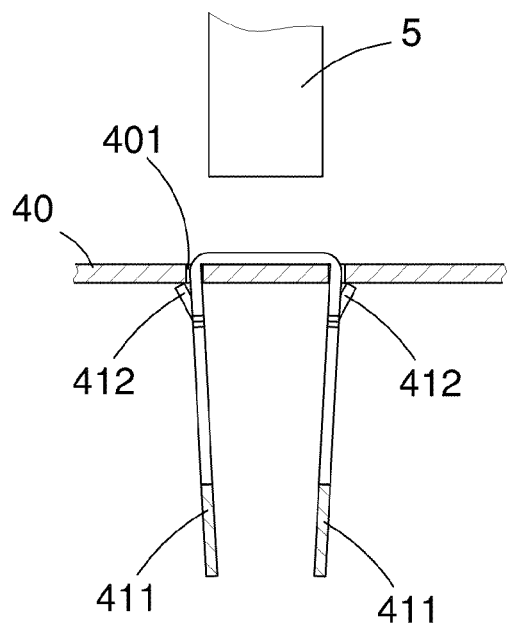
FIG. 4 shows a view of FIG. 3 after punching.

The heat dissipating plate 40 defines a plurality of slits 401 corresponding to the heat transfer mediums 41, and two through holes 402 corresponding to the two fans 43. Each of the heat transfer mediums 41 includes a base 410, two resilient connecting sheets 411 and four fastening portions 412. The two resilient sheets 411, such as copper sheets, extend from opposite ends of the base 410. Referring to FIG. 2, the two resilient sheets 411 are inserted into a pair of the slits 401, and thereby a bottom of the base 410 can be right attached to a top of the heat dissipating plate 40. Referring back to FIG. 1, two of the four fastening portions 412 extend outward from an upper portion of the respective resilient sheet 411, namely outwardly biased, for holding to a bottom of the heat dissipating plate 40. Because of being outwardly biased in the beginning, the fastening portions 412 can be compressed to be aligned with the resilient sheets 411, and can return to open outwardly again once released. Thus while the resilient sheets 411 are being inserted into the slits 401, the four fastening portions 412 are compressed as a result of the small slits 401. For this, a load 5 can be used to punch the base 410 of the heat transfer mediums 41, as shown in FIG. 3, so that the heat dissipating plate 40 can be bent upward a bit and the slits 401 be enlarged to a degree that the fastening portions 412 can bounce out from the slits 401 to abut against the bottom of the heat dissipating plate 40. After the load 5 is lifted up, as shown in FIG. 4, the heat dissipating plate 40 is released and the fastening portions 412 keep upholding the heat dissipating plate 40. In such a manner, the base 410 can be firmly attached to the heat dissipating plate 40.

Figure 5:
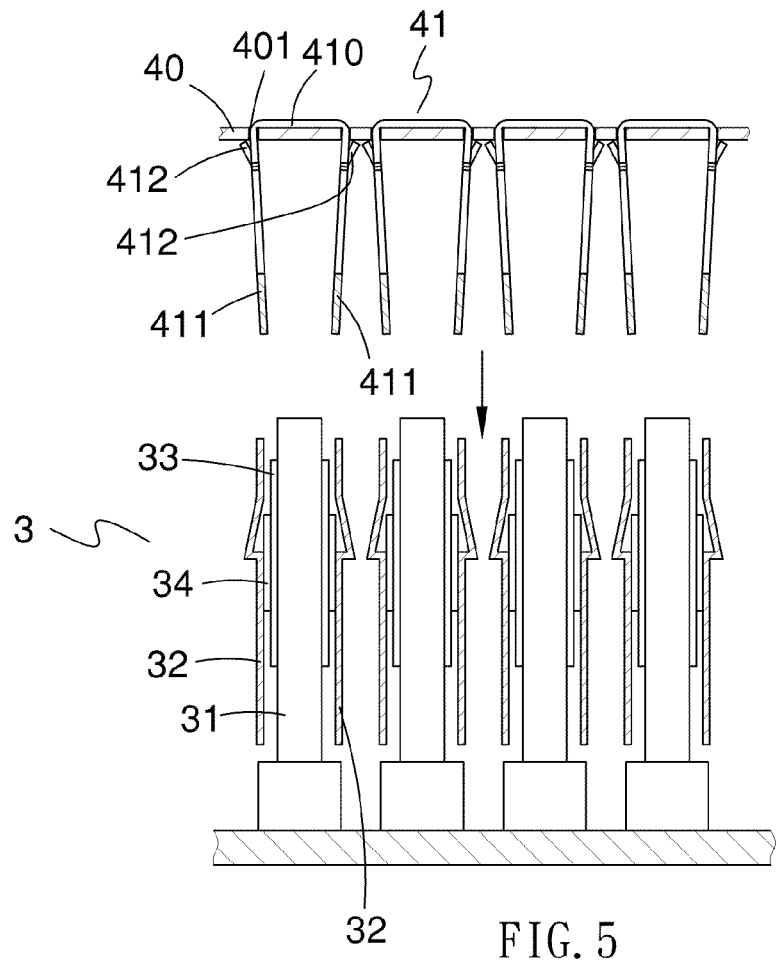
FIGS. 5 and 6 illustrate a first example of the heat transfer medium being fit into memory modules.
Figure 6:
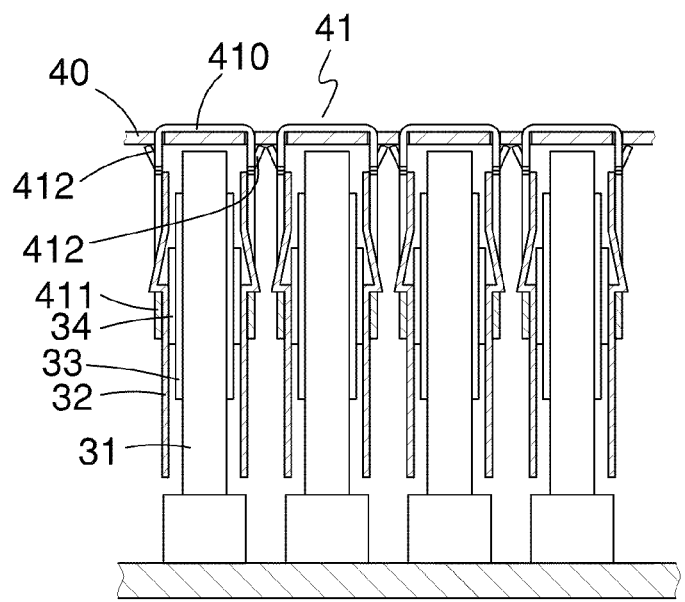

As shown in FIG. 5, before the heat sink assembly 4 is attached to the memory modules 3, the two resilient sheets 411 of each of the heat transfer mediums 41 are inwardly biased in the beginning. When the heat sink assembly 4 and the memory modules 3 are engaged as shown in FIG. 6, the two resilient sheets 411 are placed around one of the memory modules 3 and snugly attached to the two opposite heat sink plates 32 of the memory module 3 respectively. In such a manner, the heat sink assembly 4 can be perfectly fit in between the memory modules 3

Figure 7:
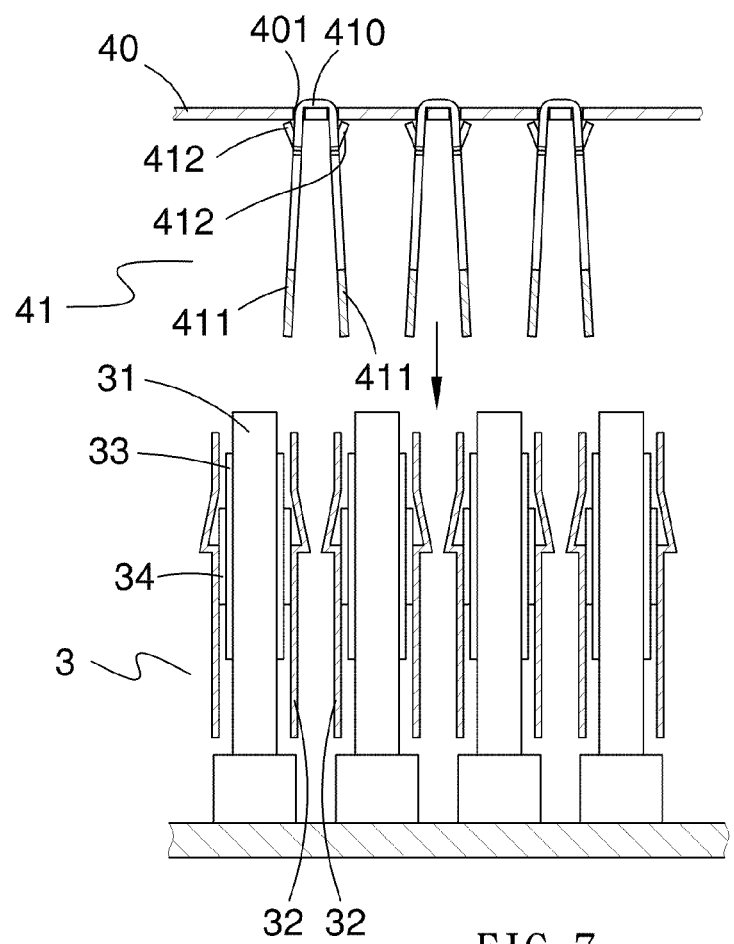
FIGS. 7 and 8 illustrate a second example of the heat transfer medium being fit into the memory modules.
Figure 8:
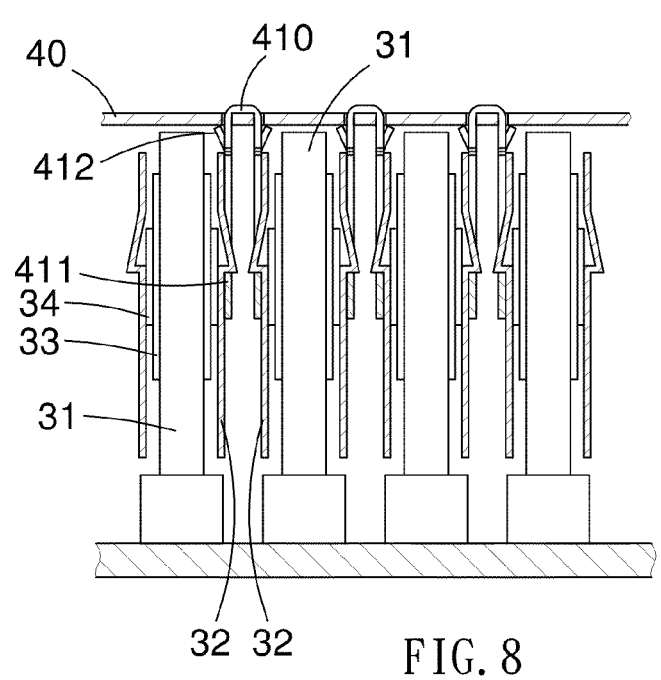

In another example, the two resilient sheets 411 of each of the heat transfer mediums 41 may be outwardly biased in the beginning, as shown in FIG. 7, so that the two resilient sheets 411 can be placed in between adjacent two of the memory modules 3 and snugly clip to the corresponding opposing heat sink plates 32 of the adjacent two memory modules 3, as shown in FIG. 8.

Figure 9:
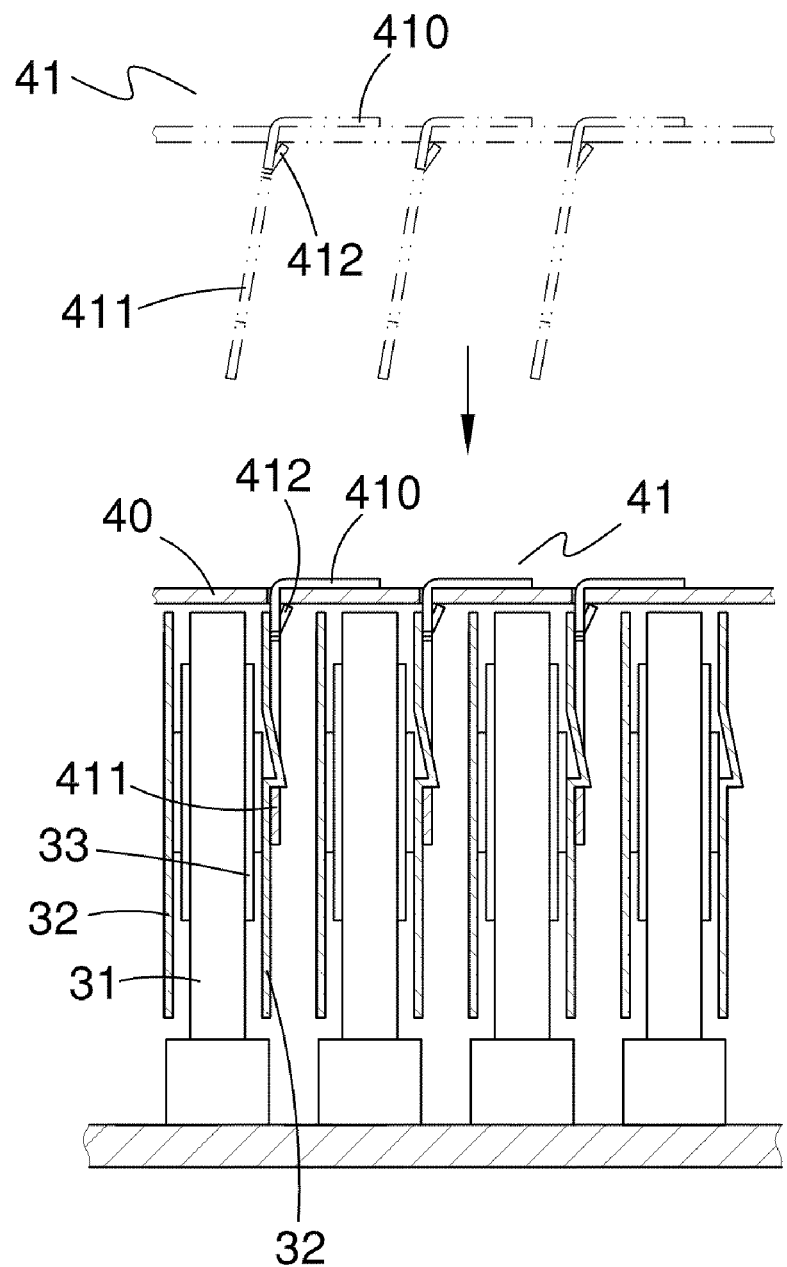
FIG. 9 illustrates a third example of the heat transfer medium being fit into the memory modules.

In yet another example, as shown in FIG. 9, each of the heat transfer mediums 41 may has only one resilient sheet 411 with one fastening portion 412 thereon. The resilient sheet 411 and the base 410, as indicated by phantom lines, define an obtuse angle, larger than 90 degrees, so that the resilient sheet 411 can be placed in a corresponding position so as to snugly clip to the right heat sink plate 32 of the respective memory module 3.

Figure 10:
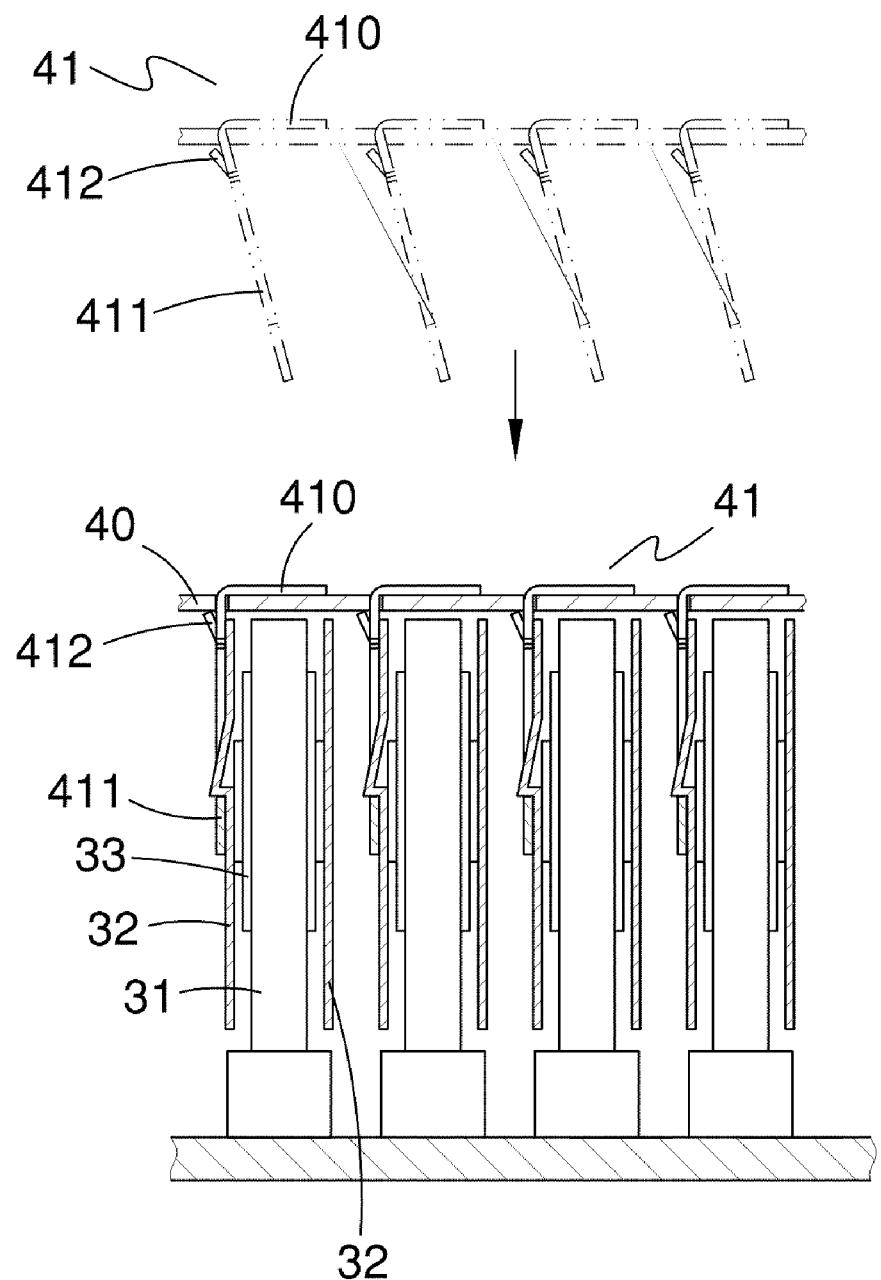
FIG. 10 illustrates a fourth example of the heat transfer medium being fit into the memory modules.
Figure 11:
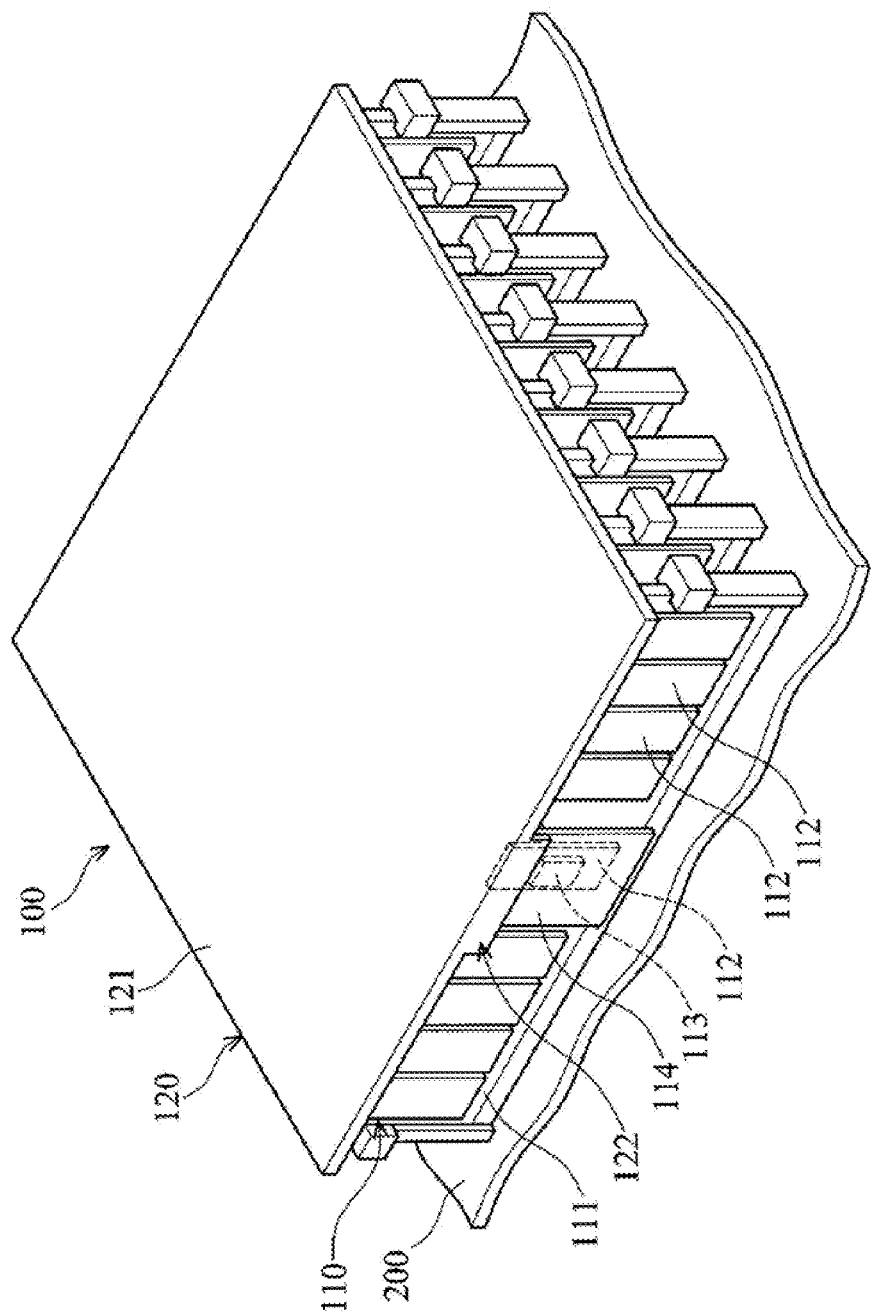
FIGS. 11 and 12 are views of a prior art.
Figure 12:
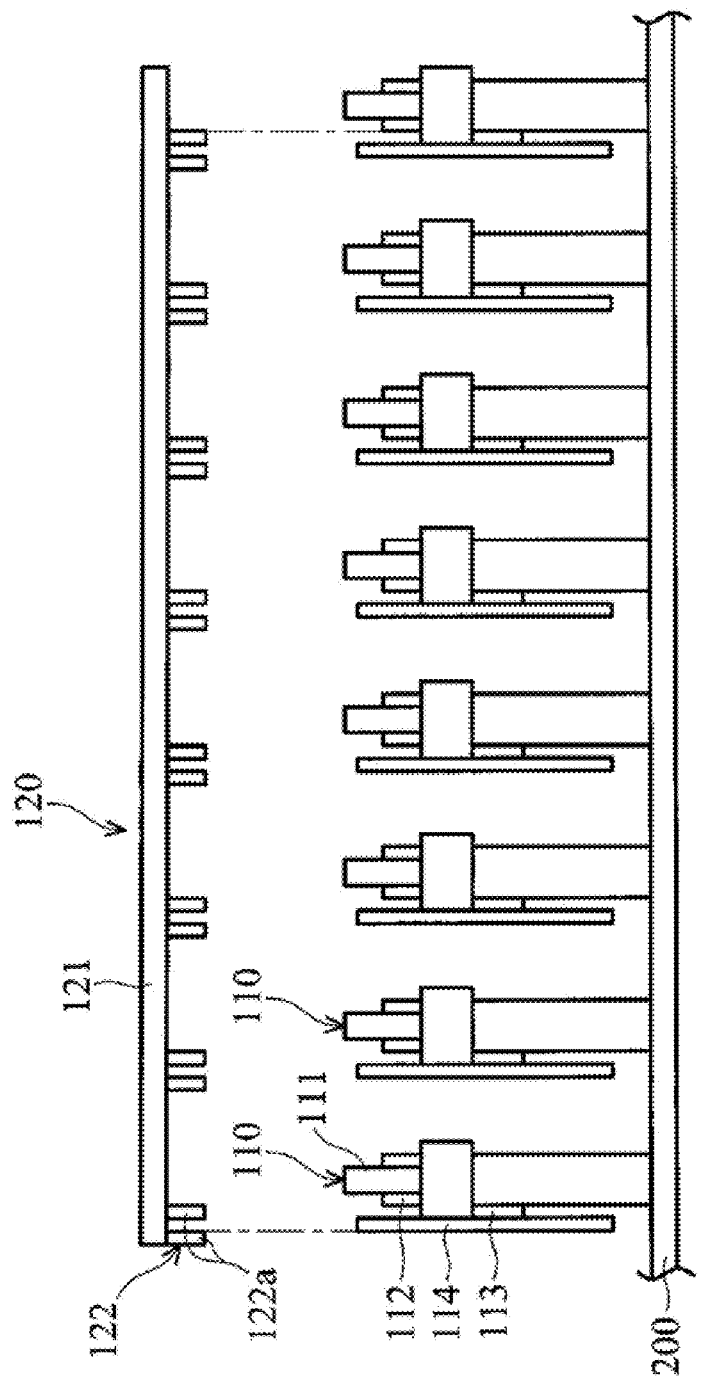

Similarly, as shown in FIG. 10, the resilient sheet 411 and the base 410 define an acute angle, smaller than 90 degrees, so that the resilient sheet 411 can be placed in another corresponding position so as to snugly clip to the left heat sink plate 32 of the respective memory module 3.

Accordingly, as long as the resilient sheet 411 and the base 410 define an included angle which is non-right angle, the resilient sheet 411 can snugly clip to the right or left heat sink plate 32 of the respective memory module 3.

Referring back to FIG. 2, the fans 43 are mounted on the heat dissipating plate 40 facing the through holes 402. In this manner, airflows generated by the fans 43 can be guided toward the memory modules 3 via the through holes 402 to enhance cooling of the memory modules 3.

Numerous characteristics and advantages of the invention have been set forth in the foregoing description. The disclosure, however, is illustrative only, and changes may be made in detail within the principle of the invention, to the full extent indicated by the broad general meaning of the terms in which the appended claims are expressed.

The invention claimed is:

1. A heat sink assembly comprising:
a heat dissipating plate formed in one piece and having a top surface, a bottom surface, a first slit extending through the heat dissipating plate from the top to bottom surfaces, and a second slit extending through the heat dissipating from the top to bottom surfaces; and
a heat transfer medium including a base secured on the top surface of the heat dissipating plate, a first connecting sheet extending from an end of the base and through the first slit to be directly in contact with a side of a first heat source, and a second connecting sheet extending from the opposite end of the base and through the second slit for snugly joining to the opposite side of the first heat source.

2. The heat sink assembly of claim 1, wherein the first and the second connecting sheets are both resilient and each is inclined with respect to the base.

3. A heat sink assembly comprising:
a heat dissipating plate formed in one piece and having a top surface, a bottom surface, a first slit extending through the heat dissipating plate from the top to bottom surfaces, and a second slit extending through the heat dissipating plate from the top to bottom surfaces; and
a heat transfer medium including a base secured on the top surface of the heat dissipating plate, a first connecting sheet extending from an end of the base and through the first slit to be directly in contact with a side of a first heat source, and a second connecting sheet extending from the opposite end of the base and through the second slit for snugly joining to a side of a second heat source.

4. The heat sink assembly of claim 3, wherein the first and the second connecting sheets are both resilient and each is inclined with respect to the base.

5. A heat sink assembly comprising:
a heat dissipating plate formed in one piece and having a top surface, a bottom surface and a first slit extending through the heat dissipating plate from the top to bottom surfaces; and a heat transfer medium including a base secured on the top surface of the heat dissipating plate, a first connecting sheet extending from an end of the base and through the first slit to be directly in contact with a side of a first heat source, and a fastening portion extending from a side of the first connecting sheet and upwardly abutting against the bottom surface of the heat dissipating plate in order to firmly attach the base to the top surface of the heat dissipating plate.

6. The heat sink assembly of claim 5 further comprising a fan, wherein the heat dissipating plate further has a through hole where the fan is mounted.

* * * * *